(12) United States Patent
Bakalski

(10) Patent No.: US 7,579,909 B2
(45) Date of Patent: Aug. 25, 2009

(54) BYPASS CIRCUIT FOR RADIO-FREQUENCY AMPLIFIER STAGES

(75) Inventor: Winfried Bakalski, Munich (DE)

(73) Assignee: Infineon Technologies AG, Neubiberg (DE)

( * ) Notice: Subject to any disclaimer, the term of this patent is extended or adjusted under 35 U.S.C. 154(b) by 54 days.

(21) Appl. No.: 11/777,025

(22) Filed: Jul. 12, 2007

(65) Prior Publication Data

US 2009/0015334 A1    Jan. 15, 2009

(51) Int. Cl.
*H03F 1/14* (2006.01)
(52) U.S. Cl. ..................... 330/51; 330/124 D
(58) Field of Classification Search .............. 330/51, 330/124 D, 294, 107
See application file for complete search history.

(56) References Cited

U.S. PATENT DOCUMENTS

| | | | | |
|---|---|---|---|---|
| 3,283,261 A * | 11/1966 | Buck | ............................. | 331/9 |
| 3,718,871 A * | 2/1973 | Kawamoto | .................. | 332/146 |
| 4,985,686 A * | 1/1991 | Davidson et al. | ........ | 330/124 R |
| 5,038,113 A * | 8/1991 | Katz et al. | ................... | 330/277 |
| 7,342,442 B2 * | 3/2008 | Nakatani et al. | .............. | 330/51 |
| 7,385,445 B2 * | 6/2008 | Wright | ........................ | 330/51 |
| 2003/0080811 A1 * | 5/2003 | Nakatani et al. | .............. | 330/51 |
| 2008/0036533 A1 * | 2/2008 | Lim | ........................ | 330/124 R |

* cited by examiner

*Primary Examiner*—Henry K Choe
(74) *Attorney, Agent, or Firm*—Slater & Matsil, L.L.P.

(57) ABSTRACT

An amplifier circuit includes an amplifier and a phase shifter coupled in parallel to the amplifier and switchable such that the phase shifter has a first impedance for an alternating signal in an on state and has a second impedance for the alternating signal in an off state. The second impedance is higher than the first impedance.

24 Claims, 5 Drawing Sheets

BYPASS CIRCUIT FOR RADIO-FREQUENCY AMPLIFIER STAGES

TECHNICAL FIELD

The present invention relates to amplifier circuits and, in particular, to circuits for bypassing amplifier stages.

BACKGROUND

In systems in which the current consumption is critical and, in addition, great power dynamics have to be processed, for example, in mobile radio systems, it is useful to switch off and bypass individual amplifier stages in RF (radio-frequency) amplifiers and/or amplifier chains. A dynamic range, for example, can be improved by this and an average current consumption can be reduced since appropriate amplifier stages can be switched off if necessary.

An example of this would be a reduction in the amplification in GSM (global system for mobile communication)/EDGE (enhanced data rates for GSM evolution) systems when, in switching, altering from GMSK (Gaussian minimum shift keying) modulation of a constant envelope to a 8-PSK (phase shift keying) modulation of a non-constant envelope. Whereas in GMSK, an amplifier can operate in the non-linear range of its amplification characteristic curve, this is no longer possible for 8-PSK, since information symbols here are not only encoded as to signal phase, but also as to signal amplitude (with symbol transitions). Another application example is a reduction in the current consumption in so-called low power modes in UMTS/3G systems.

Ways of reducing the amplification of an amplifier are, for example, wiring the amplifier and/or amplifier element, for example, a transistor, to negative feedback. In a bipolar transistor, this may, for example, be an emitter negative feedback or another feedback path in which a certain portion of the amplifier output power is returned to the amplifier input. In this manner, an amplification may be reduced, but there is no reduction in the current consumption.

Consequently, a bypass circuit that can reduce a current consumption in a bypass case and can be integrated in a common manufacturing process with the amplifier and/or amplifier element would be desirable for amplifier stages and/or amplifier elements.

SUMMARY OF THE INVENTION

According to embodiments, the present invention provides an amplifier circuit comprising an amplifier and a phase shifter that is connected in parallel to the amplifier and that is switchable such that the phase shifter has a first impedance for an alternating signal in an "on" state and has a second impedance for the alternating signal in an "off" state, the second impedance being higher than the first impedance.

BRIEF DESCRIPTION OF THE DRAWINGS

Preferred embodiments of the present invention will be detailed subsequently referring to the appended drawings, in which.

DETAILED DESCRIPTION OF ILLUSTRATIVE EMBODIMENTS

Figure 1:
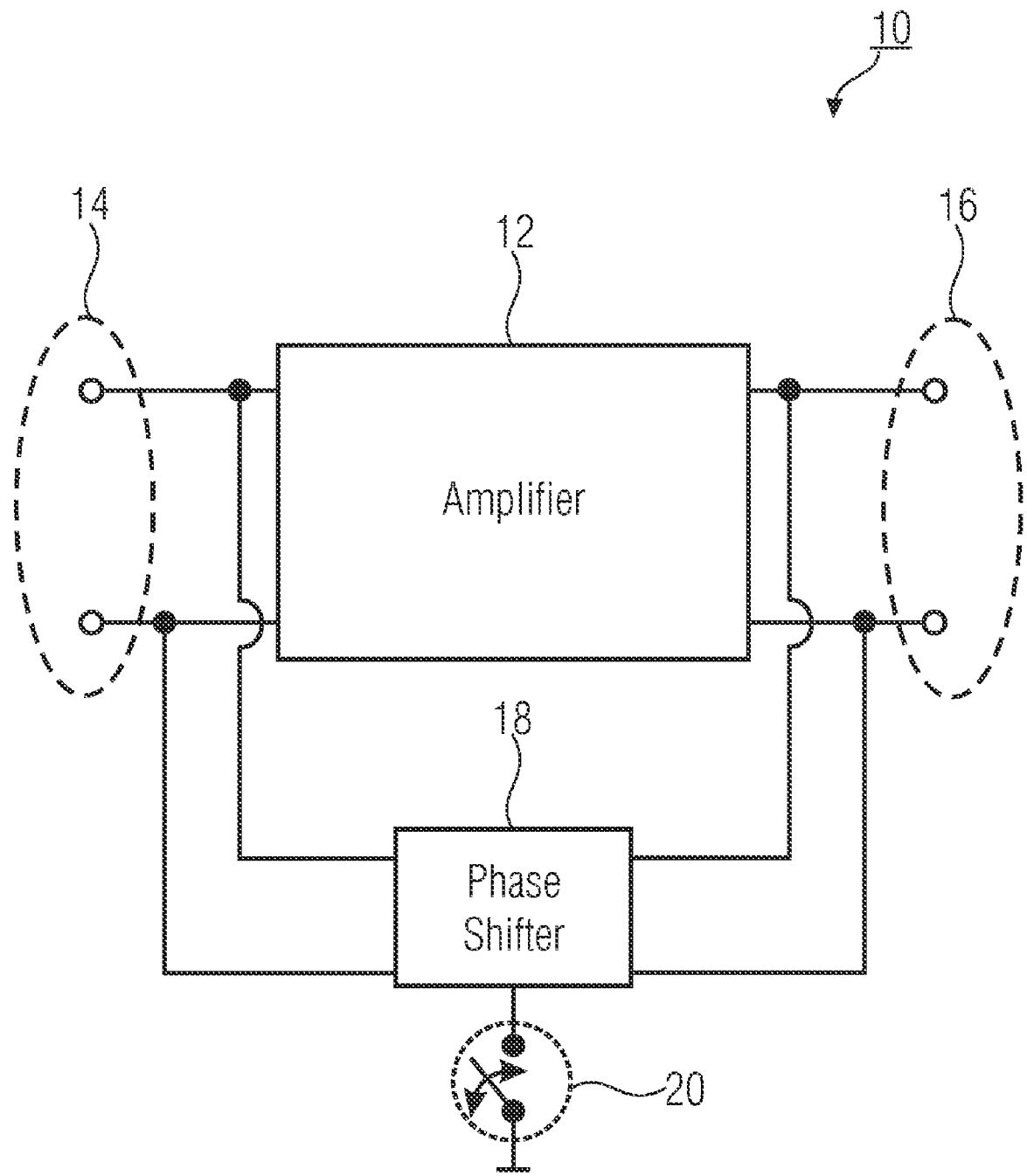
FIG. 1 is a schematic illustration of an amplifier circuit comprising an amplifier and a switchable phase shifter according to an embodiment of the present invention.

It should be kept in mind with regard to the following description that same functional elements or functional elements having the same effect are given same reference numerals in different embodiments and that the descriptions of these functional elements in different embodiments discussed below are interchangeable.

FIG. 1 shows a schematic illustration of an amplifier circuit 10 according to an embodiment of the present invention.

The amplifier circuit 10 comprises an amplifier 12 having input terminals 14 and output terminals 16. A phase shifter network 18 is coupled in parallel to the amplifier 12, i.e., between the input terminals 14 and the output terminals 16. A switch 20 is arranged between the phase shifter network 18 and a reference potential that may, for example, be a ground potential.

The phase shifter network, or phase shifter 18, is switchable by means of the switch 20 such that it has a first impedance for an alternating signal applied to the input terminals 14 in an "on" state (exemplarily with the switch 20 closed) and has a second impedance for the alternating signal in an "off" state (exemplarily with the switch 20 open), the second impedance being higher than the first impedance. The alternating signal according to embodiments is a radio-frequency alternating signal, i.e., an RF signal in a frequency range of, for example, 3 MHz to 30 GHz.

According to embodiments, the amplifier, or amplifier element 12, is also switchable such that the amplifier 12 is switched off when the phase shifter 18 is switched on and is bypassed by the phase shifter 18. When the phase shifter 18 is in an "off" state, the amplifier 12 is switched on to amplify the RF signal. The phase shifter 18, when switched off, has a higher resistance and/or a higher impedance for the RF signal when the amplifier 12 is switched off, so that the amplifier bypassing circuit through the phase shifter 18, is at least nearly disabled. In particular, when the phase shifter 18 is switched off, it is a high-impedance negative feedback branch for the amplifier 12, when switched on, to feed an amplifier output signal back to the amplifier input. When the amplifier 12 is switched off, the phase shifter 18, when switched on, however, causes a phase shift of the input signal at the input terminals 14 relative to the output signal that may be tapped at the output terminals 16.

Figure 2:
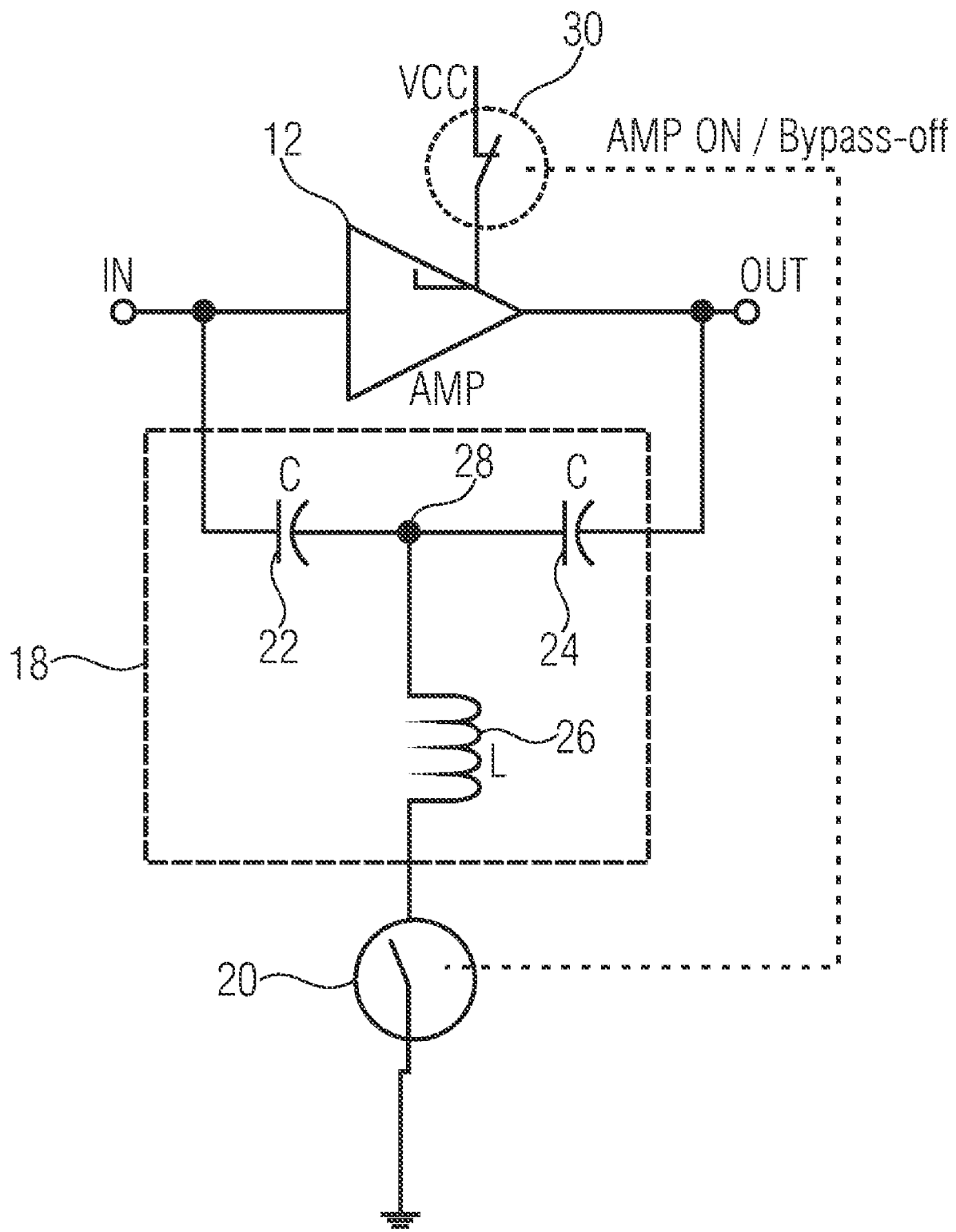
FIG. 2 is an illustration of an amplifier circuit comprising an amplifier and a switchable symmetric phase shifter connected in parallel to the amplifier according to an embodiment of the present invention.

According to embodiments, the phase shifter 18 is a symmetric quadripole, as is shown in FIG. 2, making use of a specific embodiment.

FIG. 2 shows a phase shifter 18 connected in parallel to an amplifier element 12 in the form of a symmetric network or symmetric quadripole having reactance elements switchable via the switch 20.

The phase shifter 18 has two capacitances 22, 24 in series connected in parallel to the amplifier 12, and an inductance 26 connected with a first terminal to a circuit node 28 between the two capacitances 22, 24 and connected with a second terminal to the switch 20, so that the second terminal of the inductance 26 is connected to the reference potential or ground potential when the switch 20 is closed. The amplifier element 12 may be part of an amplifier chain and may be switched on and off by a switch 30.

Since the phase shifter 18, according to embodiments, is a symmetric quadripole, the two capacitances 22, 24 connected in series are identical. "Identical" here means what is referred to as identical in current manufacturing processes. If the capacitance 22 has a value $C_1$ and the capacitance 24 has a value $C_2$, the two capacitances 22, 24 will consequently be identical within a tolerance range of, for example, ±15%, i.e. $0.85 < C_1/C_2 < 1.15$.

A symmetric quadripole terminated by its characteristic impedance also has its characteristic impedance as input resistance. This means that it does not transform the resistance and absolute value of a voltage. Current and voltage are of the same phase shift. By suitably dimensioning the capacitances 22, 24 and the inductance 26, a 90° phase shift may exemplarily be obtained in a predefined frequency range from the input terminals 14 to the output terminals 16.

When the switch 20 is closed (phase shifter 18 switched on) and at the same time the switch 30 is open (amplifier 12 switched off), the phase shifter 18 is switched on and the amplifier 12, when switched off, is bypassed by the phase shifter 18 by conducting a signal, in particular an RF signal, from the input terminals 14 via the phase shifter 18 to the output terminals 16 of the amplifier 12.

If the amplifier 12 is, for example, connected with its input terminals 14 to a signal source having an internal resistance of, for example, 50 ohms, and if the phase shifter 18 also has a characteristic impedance of 50 ohms due to the dimensioning of its elements 22, 24, and 26, the phase shifter 18 will transform the 50 ohms of the signal source to the output of the amplifier 12. If the output of the amplifier 12 is, for example, interconnected with a downstream amplifier stage, the downstream amplifier stage will "see" the 50 ohms of the signal source at the input of the amplifier 12. Here, the term "downstream amplifier stage" denotes the next amplifier stage following a reference amplifier stage in an amplifier chain. The same is, for example, true when an antenna assembly having an antenna base resistance of, for example, 50 ohms, is connected to the output of the amplifier 12. In these cases, further impedance matching may not be necessary. The RF signal from the signal source applied to the input of the amplifier 12 can thus be redirected by the phase shifter 18 without any appreciable impedance transformation to the amplifier output, thereby not requiring additional matching networks in an amplifier circuit.

The amplifier 12 may, for example, be an amplifier output stage of an entire amplifier chain having upstream driver stages that can be switched off and bypassed by embodiments of the present invention in the case of a lower desired output power. Here, the term upstream amplifier stage denotes the amplifier stage before a reference amplifier stage in an amplifier chain.

If the switch 20 is opened, thereby separating the inductance 26 from the reference potential, the result will basically be a series connection of the two capacitances 22, 24 connected in parallel to the amplifier 12. This series connection of the two capacitances 22, 24 results in a total capacitance $C_{tot}$, formed by the two series capacitances 22, 24, is halved and thus, becomes considerably smaller than the capacitance values $C_1$ and $C_2$. The result, with the amplifier 12 enabled (exemplarily switch 30 closed) and the switch 20 open, i.e., phase shifter 18 switched off, will only be a very marginal negative feedback over the two capacitances 22, 24 connected in series. Stability problems can be avoided by the reduced total capacitance $C_{tot}$ and the resulting low negative feedback and/or feedback.

In one implementation of a circuit according to embodiments of the present invention, effects caused by leads have to be taken into consideration and connecting points of phase shifter 18 to the input and output of the amplifier 12 should be selected in a suitable manner to avoid undesired oscillations.

If an amplifier circuit is, according to embodiments, for example, employed at an operating frequency in a range around 900 MHz (megahertz), for a characteristic impedance of the phase shifter 18 of 50 ohms and a phase shift of 90°, capacitance values $C_1=C_2=3.5$ pF (pico Farad) and an inductance value L=8.8 nH (nano-Henry) will be necessary. The series connection of the two capacitances 22, 24, when the phase shifter 18 is switched off, will result in a total series capacitance $C_{tot}=C_1/2=C_2/2=1.75$ pF.

According to embodiments, the switch 20 between the reference potential and the inductance 26 can be realized by a bipolar transistor or a field-effect transistor. When the amplifier is switched off, only a current and/or a voltage for the switch 20 will be necessary, thereby considerably reducing the power consumption.

Embodiments of the present invention are, of course, not limited to the T arrangement of the phase shifter network 18 shown in FIG. 2. Different phase shifter topologies, for example, Pi circuits and the like, are also conceivable. In addition, a 90° phase shift is not absolutely necessary, other phase angles between input and output being conceivable.

Figure 3:
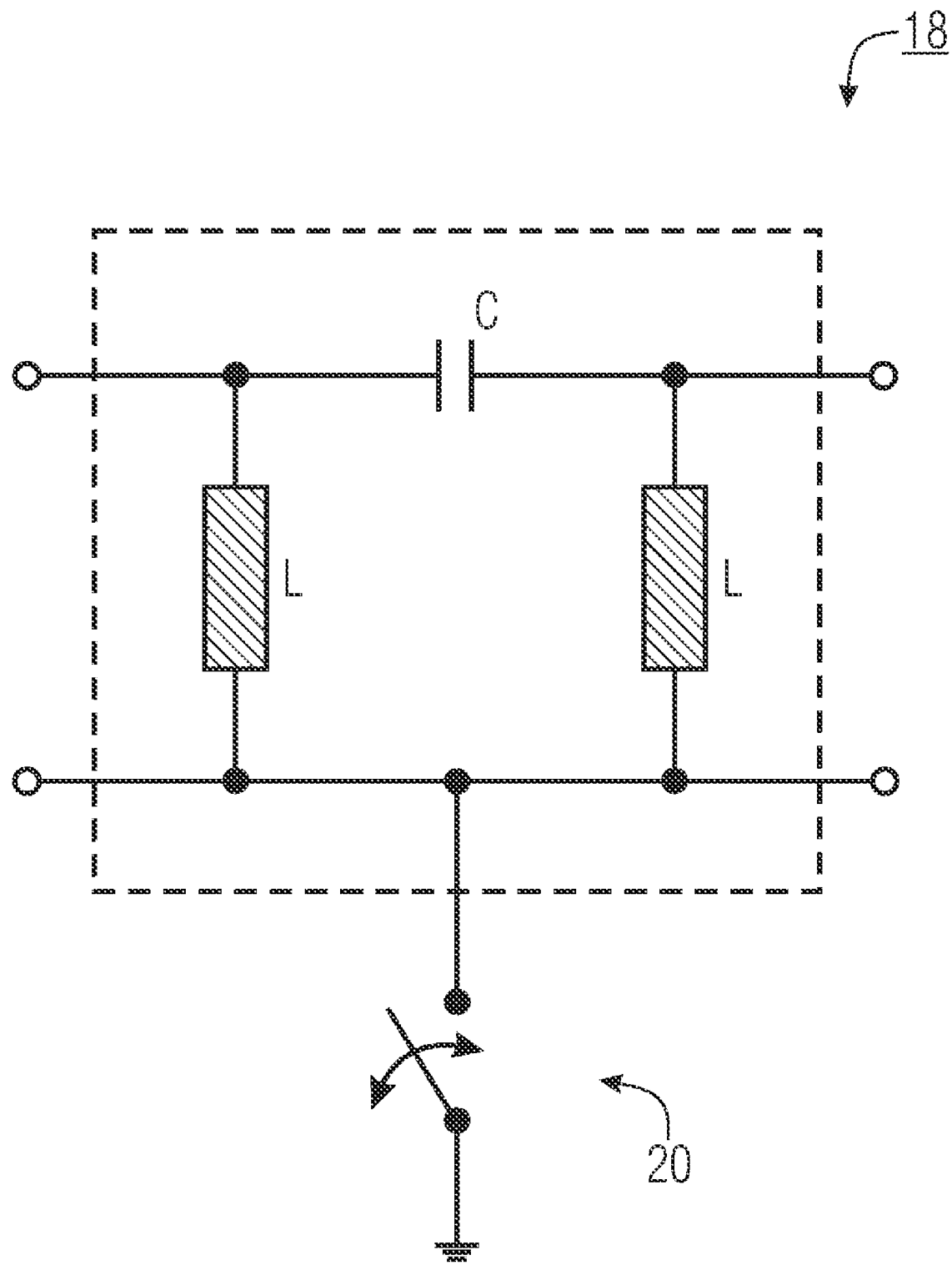
FIG. 3 is an illustration of a switchable symmetric phase shifter according to another embodiment of the present invention.

Another way of realizing a phase shifter 18 in a Pi circuit assembly switchable by a switch 20, which is possible in principle, is exemplarily illustrated in FIG. 3. The Pi circuit can be dimensioned such that it has similar characteristics to the T circuit described referring to FIG. 2.

After having described the concept on which the invention is based referring to FIGS. 1 to 3, a specific embodiment of the circuit illustrated in FIG. 2 is to be described subsequently making reference to FIG. 4.

Figure 4:
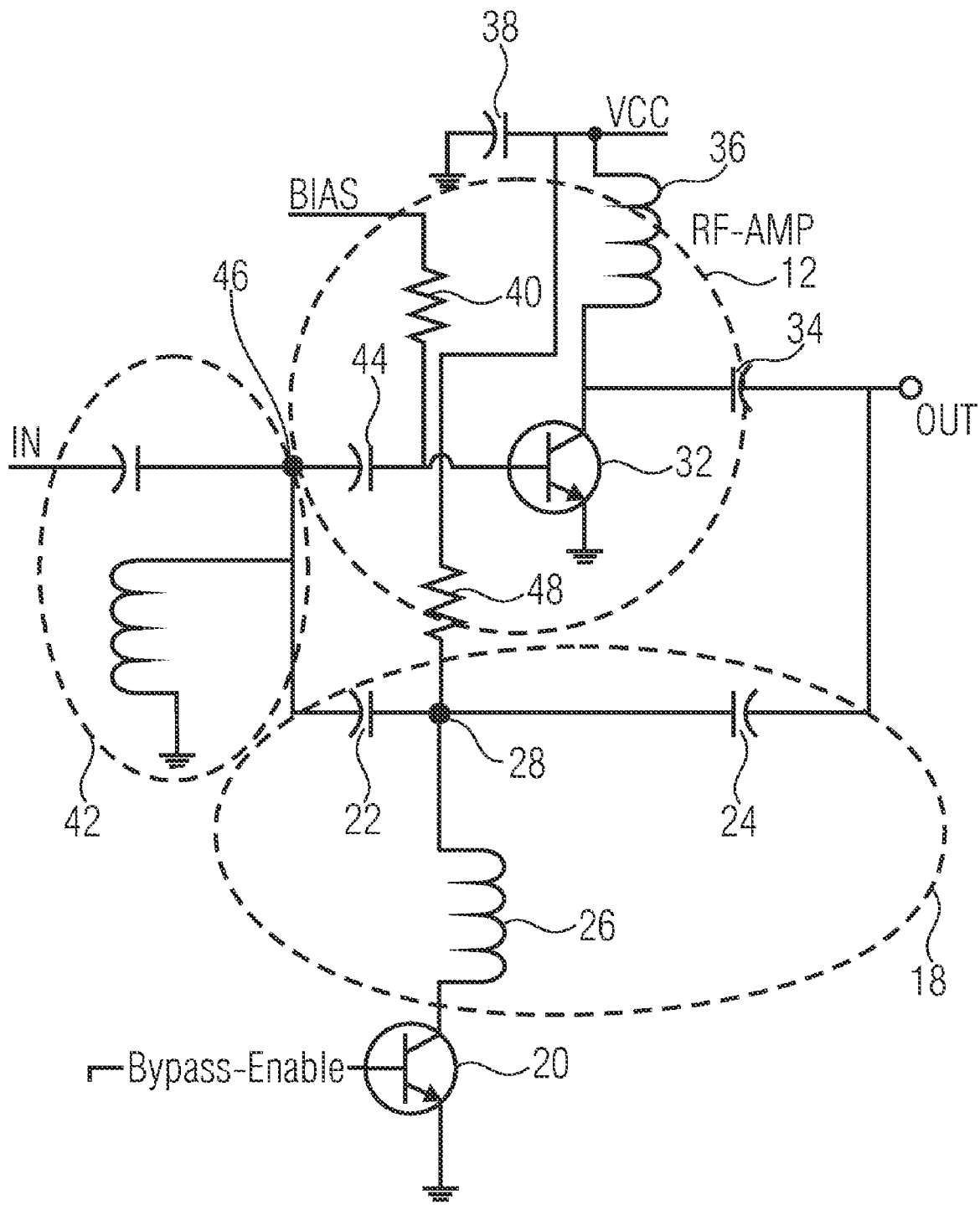
FIG. 4 shows an amplifier circuit comprising a transistor, a matching network, and a switchable phase shifter according to an embodiment of the present invention.

The amplifier circuit shown in FIG. 4 comprises an amplifier 12 having a bipolar transistor 32 and a coupling capacitor 34 being connected between an output terminal of the amplifier circuit and the collector terminal of the bipolar transistor 32. Furthermore, the drain or collector terminal of the transistor 32 is connected to a supply potential VCC via a choke coil 36. In parallel to the transistor 32, a capacitor 38 is connected between the supply potential VCC and ground. A bias current is fed to the control and/or base terminal of the transistor 32 via a resistor 40 when the amplifier 12 is switched on. Another coupling capacitor 44 is connected between an input-side matching network 42 and the base terminal of the transistor 32. A phase shifter 18 comprising two capacitances 22, 24 connected in series and an inductance connected between the two capacitances 22, 24 and a switch 20 is connected, in parallel to the amplifier 12, between the output terminal of the amplifier circuit and a circuit node 28 between the coupling capacitor 44 and the matching network 42. In FIG. 4, the switch 20 is realized as a bipolar transistor, the collector terminal that is connected to the inductance 26 and the source or emitter terminal, that is connected to the ground potential. A control signal determining whether the bipolar transistor 20 is in a high-impedance or low-impedance state is fed to the base terminal of the switching bipolar transistor 20. In addition, a resistor 48 is connected between the circuit node 28 between the two capacitances 22, 24 and the supply potential VCC.

The matching network 42 transforms an internal resistance of a signal source (not shown) connected on the input side to the matching network 42 to a value suitable and/or optimal for the input of the transistor 32. According to embodiments, the elements 22, 24, 26 of the phase shifter 18 can be dimensioned such that the internal resistance of the signal source transformed by the matching network 42 is mapped unchanged to the output of the amplifier circuit of FIG. 4. For the case of a symmetric phase shifter 18, which means that the capacitances 22, 24 are identical, the capacitances 22, 24 and the inductance 26 here are dimensioned such that the internal resistance of the signal source transformed by the matching network 42, at the circuit node 46, corresponds to the characteristic impedance of the phase shifter 18. Thus, the circuit node 28 or 46 can be mapped to the output of the amplifier circuit illustrated in FIG. 4.

The resistor 48 supplies the switching transistor 20 with current from the VCC pin and, at the same time, is used to decouple RF voltage of the inductance 26 from the VCC pin to avoid interactions.

The bypass circuit and/or the phase shifter 18 is switched on when the bypass enable signal applied to the base terminal of the transistor 20 transitions to a "high" state. According to embodiments, this bypass enable signal can also control the bias current for the transistor 32 such that, when the bypass enable signal is applied ("high" state), the bias current for the transistor 32 is switched off and thus the amplifier 12 is disabled. In this case, an RF signal can migrate unamplified via the phase shifter 18 to the output of the amplifier circuit.

However, if the amplifier 12 is not to be bypassed, the bypass enable signal will transition to a "low" state and exemplarily enable the bias current for the transistor 32 at the same time so that the amplifier 12 is enabled and the phase shifter 18 is switched off. In this case, there is only a very marginal feedback from the output via the two series capacitances 22, 24 to the input (node 46), so that the amplification power of the amplifier 12 is hardly impeded.

If an amplifier output stage is to be bypassed by the switch and/or the transistor 20, an inductance and/or coil 26 of high quality and a field-effect transistor of a small drain-source resistance as switch 20 should be provided.

Figure 5:
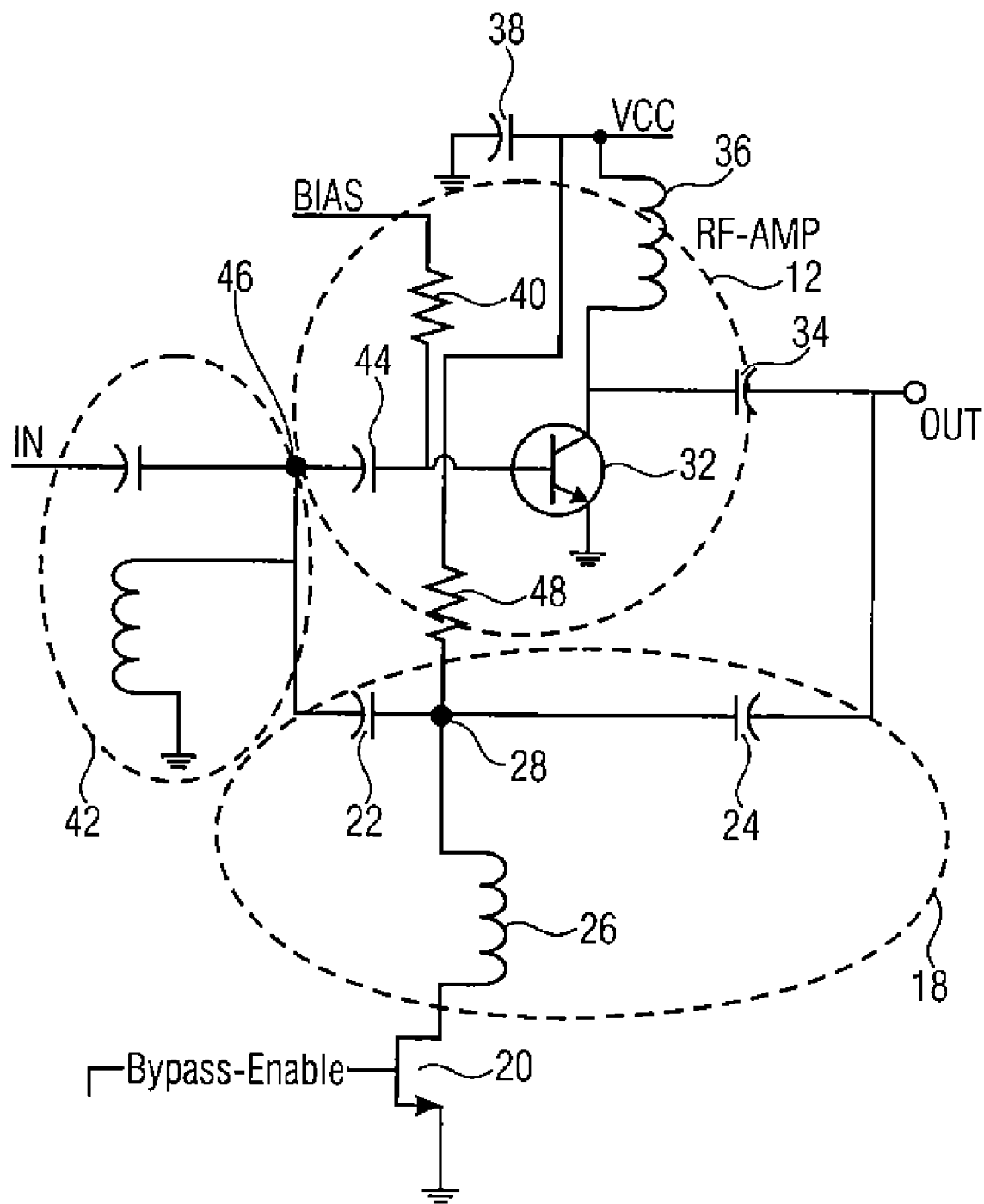
FIG. 5 illustrates an alternative embodiment amplifier circuit.

In an alternative embodiment of the present invention, switch 20 is implemented as a field-effect transistor, as shown in FIG. 5. The gate of field-effect transistor is coupled to the Bypass-Enable signal, the drain of the field-effect transistor is coupled to inductor 26, and the source of the field-effect transistor is coupled to ground.

In summary, embodiments of the present invention provide an amplifier bypass circuit by means of a switchable phase shifter for bypassing an RF amplifier stage. In order to bypass an amplifier, a switchable phase shifter is connected in parallel to the amplifier so that the phase shifter has a first impedance for an alternating signal in an on state (bypass) and has a second impedance for the alternating signal in an off state (no bypass), the second impedance being higher than the first impedance.

According to embodiments, a symmetric T circuit, the inductance 26 that may be separated by a switch 20 if necessary (no bypass), can be used as a phase shifter. The switch 20 may, according to embodiments, be a bipolar or a field-effect transistor. When the bypass is switched off, i.e., the phase shifter 18 switched off and/or inductance 26 separated, there will be slight negative feedback from the output to the input of the amplifier by the series capacitances 22, 24. If the amplifier bypass is enabled, the RF amplifier will exemplarily be switched off via a bias current and at the same time the inductance of the T circuit connected to a reference potential via the switch.

Bypass circuits, according to embodiments of the present invention, can additionally avoid noise by the RF amplifier stage bypassed correspondingly. Furthermore, a current consumption can be reduced since only the switching transistor 20 will be enabled when the amplifier is switched off.

Finally, it is to be pointed out that the present invention is, neither limited to the respective elements of the amplifier circuit, nor to the procedure discussed since these elements and methods may vary. The terms used here are only to describe special embodiments and are not used in a limiting sense. When the singular form or indefinite articles are used in the description and the claims, they also refer to the plural form of these elements, unless the overall context unambiguously illustrates something else. This is also true for the reverse direction.

What is claimed is:

1. An amplifier circuit comprising:
   an amplifier comprising an input terminal and an output terminal; and
   a phase shifter comprising an input terminal coupled to the input terminal of the amplifier, and an output terminal coupled to the output terminal of the amplifier, wherein the phase shifter is switchable such that the phase shifter has a first impedance for an alternating signal in an "on" state and has a second impedance for the alternating signal in an "off" state, the second impedance being higher than the first impedance,
   wherein the phase shifter comprises two capacitances in series, the two capacitances connected in parallel to the amplifier, and an inductance that is connected with a first terminal to a circuit node between the two capacitances and is connected with a second terminal to a switch so that the second terminal of the inductance is connected to a reference potential when the switch is closed.

2. The amplifier circuit according to claim 1, wherein the amplifier is switchable and is switched off when the phase shifter is in the "on" state and is switched on when the phase shifter is in the "off" state.

3. The amplifier circuit according to claim 1, wherein the amplifier comprises a transistor.

4. The amplifier circuit according to claim 3, wherein the transistor is switched on and off via a bias signal at its control input.

5. The amplifier circuit according to claim 1, wherein the phase shifter comprises a symmetric quadripole.

6. The amplifier circuit according to claim 1, wherein the phase shifter comprises exclusively reactance elements.

7. The amplifier circuit according to claim 1, wherein the two capacitances connected in series comprise capacitance values $C_1$ and $C_2$ that are identical within a tolerance range of ±15%.

8. The amplifier circuit according to claim 1, wherein the switch comprises a field-effect transistor.

9. The amplifier circuit according to claim 1, wherein the switch comprises a bipolar transistor.

10. An amplifier circuit comprising:
    a transistor; and
    a switchable phase shifter coupled in parallel to the transistor, the phase shifter comprising two capacitances in series, that are coupled in parallel between a control terminal and a drain or collector terminal of the transistor, the phase shifter further comprising an inductance including a first terminal coupled to a circuit node between the two capacitances, the inductance also including a second terminal coupled to a switch so that the second terminal of the inductance is coupled to a reference potential when the switch is closed.

11. The amplifier circuit according to claim 10, wherein the transistor is switchable via a bias signal at its control input and is switched off when the phase shifter is in an "on" state and is switched on when the phase shifter is in an "off" state.

12. The amplifier circuit according to claim 10, wherein the phase shifter comprises a symmetric network.

13. The amplifier circuit according to claim 10, wherein the phase shifter comprises exclusively reactance elements.

14. The amplifier circuit according to claim 10, wherein the two capacitances connected in series comprise capacitance values $C_1$ and $C_2$ that are identical within a tolerance range of ±15%.

15. The amplifier circuit according to claim 10, wherein the switch comprises a field-effect transistor.

16. The amplifier circuit according to claim 10, wherein the switch comprises a bipolar transistor.

17. A method for bypassing an amplifier, the method comprising:
coupling an input terminal of a switchable phase shifter to an input terminal of an amplifier, and coupling an output terminal of the switchable phase shifter to an output terminal of the amplifier wherein the phase shifter has a first impedance for an alternating signal in an "on" state and has a second impedance for the alternating signal in an "off" state, the second impedance being higher than the first impedance, wherein the phase shifter is connected such that two capacitances are in series, connected in parallel to the amplifier, and an inductance is connected between a circuit node between the two capacitances and a switch so that the inductance is connected to a reference potential when the switch is closed and is not connected to the reference potential when the switch is open.

18. The method according to claim 17, wherein the amplifier is switched off when switching on the phase shifter and is switched on when switching off the phase shifter.

19. The method according to claim 18, wherein the amplifier is switched on and off via a bias signal at a control input.

20. The method according to claim 17, wherein the phase shifter is set up as a symmetric quadripole.

21. The method according to claim 17, wherein the phase shifter is set up exclusively of reactance elements.

22. The method according to claim 17, wherein capacitances are wired having capacitance values $C_1$ and $C_2$ that are identical within a tolerance range of ±15%.

23. The method according to claim 17, wherein the phase shifter is switched on and off by means of a field-effect transistor as the switch.

24. The method according to claim 17, wherein the phase shifter is switched on and off by means of a bipolar transistor as the switch.

* * * * *